United States Patent
McClure et al.

(10) Patent No.: US 7,411,433 B2
(45) Date of Patent: Aug. 12, 2008

(54) RESET RAMP CONTROL

(75) Inventors: David Charles McClure, Carrollton, TX (US); Rong Yin, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 198 days.

(21) Appl. No.: 11/012,693

(22) Filed: Dec. 15, 2004

(65) Prior Publication Data

US 2005/0134346 A1 Jun. 23, 2005

Related U.S. Application Data

(60) Provisional application No. 60/530,727, filed on Dec. 18, 2003.

(51) Int. Cl.
*H03K 17/22* (2006.01)
(52) U.S. Cl. ...................... 327/143; 327/198
(58) Field of Classification Search ................. 327/142, 327/143, 198
See application file for complete search history.

(56) References Cited

U.S. PATENT DOCUMENTS

| | | | | |
|---|---|---|---|---|
| 4,833,342 A | * | 5/1989 | Kiryu et al. | 327/541 |
| 5,109,163 A | * | 4/1992 | Benhamida | 327/143 |
| 5,115,146 A | * | 5/1992 | McClure | 327/143 |
| 5,440,254 A | * | 8/1995 | Sundby | 327/79 |
| 5,534,804 A | * | 7/1996 | Woo | 327/143 |
| 5,602,502 A | * | 2/1997 | Jiang | 327/143 |
| 5,778,238 A | * | 7/1998 | Hofhine | 713/340 |
| 5,917,255 A | * | 6/1999 | Ciccone | 307/130 |
| 6,118,315 A | * | 9/2000 | Guedj | 327/143 |
| 6,181,628 B1 | * | 1/2001 | Reynolds | 365/226 |
| 6,204,701 B1 | * | 3/2001 | Tsay et al. | 327/143 |
| 6,204,704 B1 | * | 3/2001 | Williams et al. | 327/143 |
| 6,515,523 B1 | * | 2/2003 | Bikulcius | 327/142 |
| 7,019,417 B2 | * | 3/2006 | Kang | 307/113 |
| 7,034,581 B2 | * | 4/2006 | Sudou | 327/143 |
| 7,208,987 B2 | * | 4/2007 | McClure | 327/143 |
| 2006/0091923 A1 | * | 5/2006 | Ohtake | 327/198 |

* cited by examiner

*Primary Examiner*—N. Drew Richards
*Assistant Examiner*—Thomas J Hiltunen
(74) *Attorney, Agent, or Firm*—Lisa K. Jorgenson; Renee Michelle Leveque

(57) ABSTRACT

A reset ramp control structure and method is described. A fast ramp down condition of a monitored voltage is detected and used to force the state of system reset. Delay between fast ramp detection and the forcing of system reset is adjustable. Operation is adaptable to include all DC power systems. The reset ramp control structure provides operational protection during fast ramp down conditions when standard reset circuitry may not be operational.

26 Claims, 4 Drawing Sheets

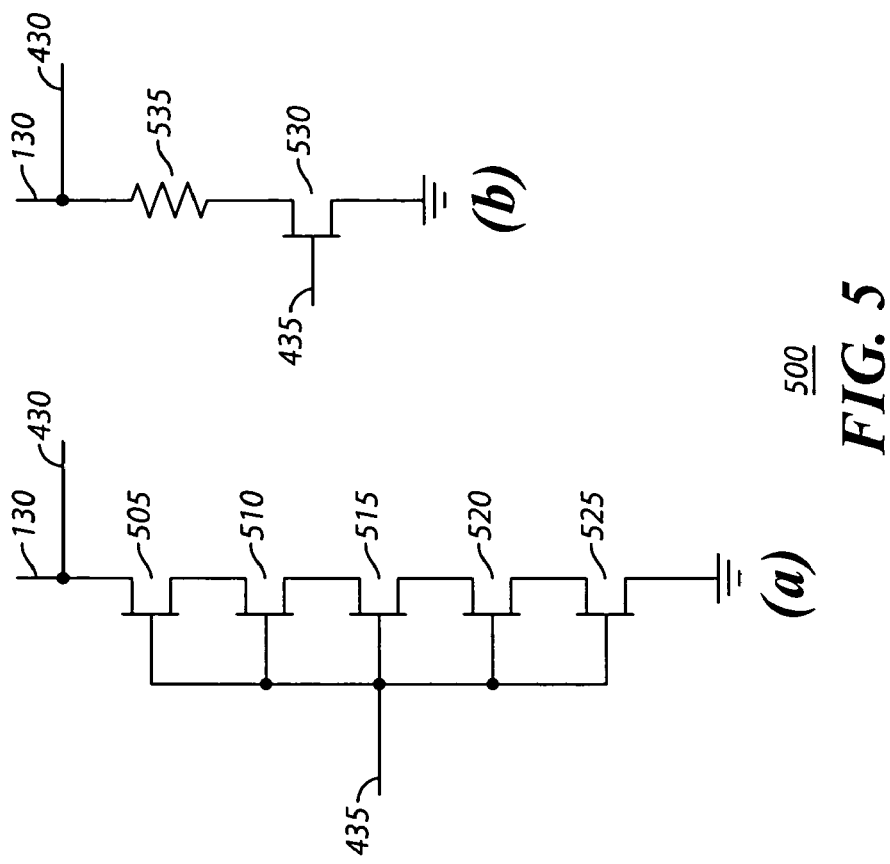
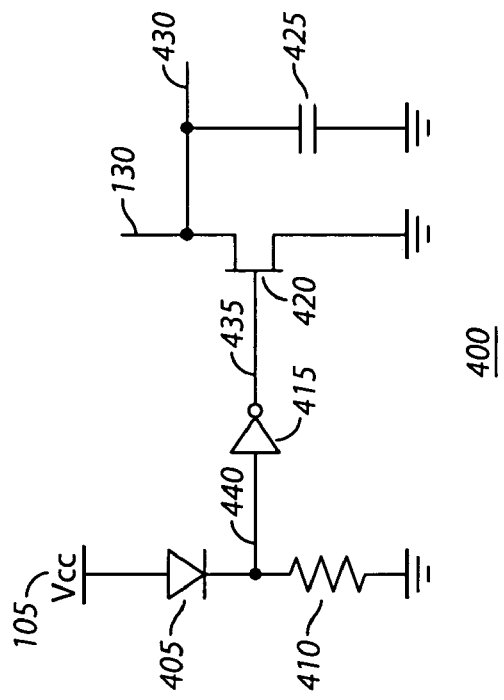
FIG. 4
FIG. 5

RESET RAMP CONTROL

PRIORITY CLAIM

This application claims priority from the provisional U.S. patent application titled "Reset Ramp Control", filed Dec. 18, 2003 and identified by application Ser. No. 60/530,727, which is hereby incorporated herein by reference.

BACKGROUND

Reset circuits are used to monitor power supplies in microprocessors, digital equipment, and various other electronic equipment and systems. A reset circuit is used to assert a reset signal whenever the supply voltage falls below a determined threshold voltage and to de-assert said reset signal when the supply voltage rises above a threshold. This reset signal may be input to the microprocessor, for example, to start the microprocessor in a known state during power up to prevent code execution errors, during power down to initiate a clean shutdown sequence, and during brownout to achieve control over marginal voltage conditions.

One deficiency of reset circuits is that proper assertion of reset signals during power down conditions may not reliably occur. The power supply voltage may decrease so quickly that existing reset detection circuitry may cease functioning before outputting a valid (changed) reset state.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 4 is a simplified schematic diagram of a reset ramp control circuit, in accordance with certain embodiments of the present invention.

FIG. 5 is a simplified schematic diagram of equivalent circuits, in accordance with certain embodiments of the present invention.

DETAILED DESCRIPTION

Figure 1:
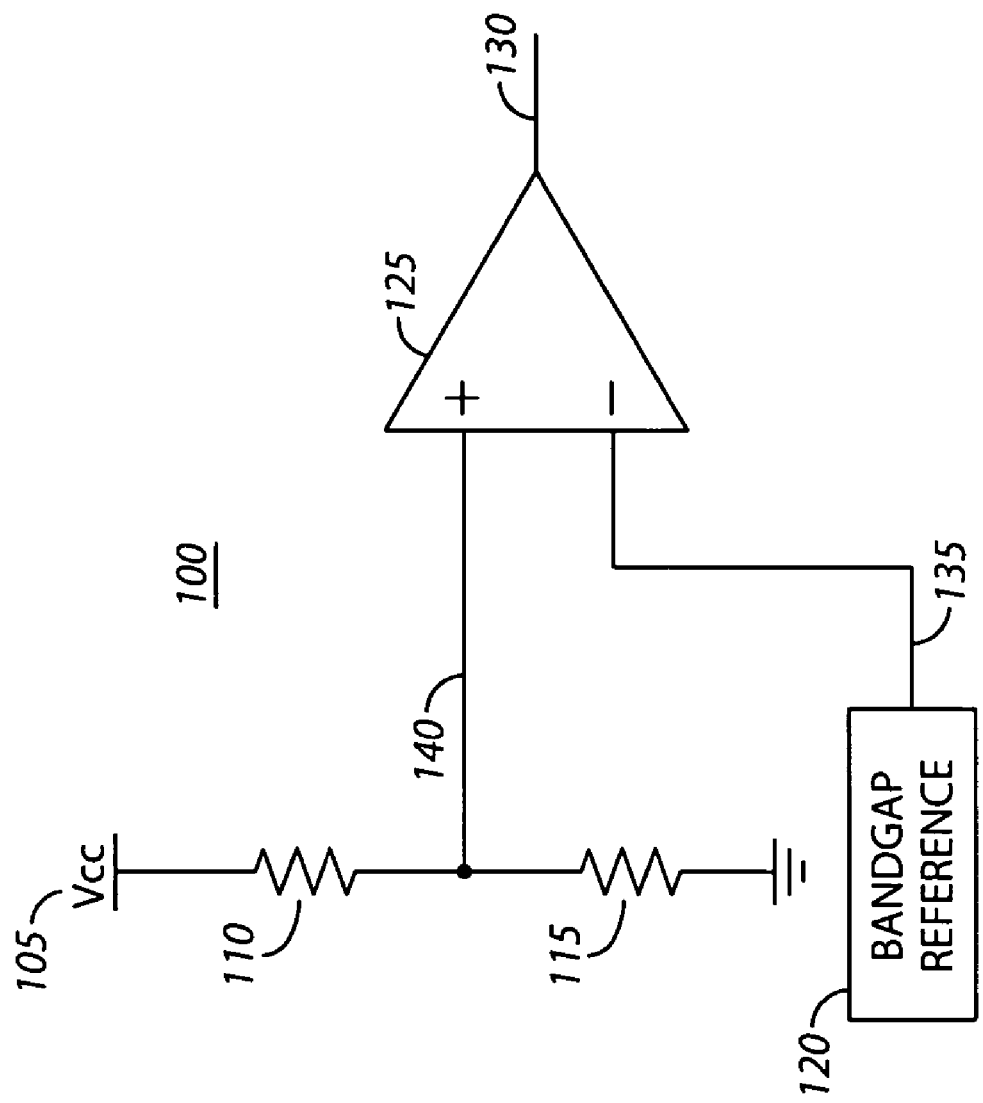
FIG. 1 is an exemplary simplified diagram of a reset system.

A structure and method for providing reset ramp control during fast ramp down conditions is presented, in accordance with certain embodiments of the present invention.

Many variations, equivalents and permutations of these illustrative exemplary embodiments of the invention will occur to those skilled in the art upon consideration of the description that follows. The particular examples utilized should not be considered to define the scope of the invention. For example discrete circuitry implementations and integrated circuit implementations, and hybrid approaches thereof, may be formulated using techniques of the present invention. Another example would be an implementation of the reset ramp control functional elements across a system.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

For purposes of this document, the exact mechanical and electrical parameters of equipments are unimportant to an understanding of the invention, and many different types of electrical and mechanical components may be utilized without departing from the spirit and scope of the invention. An example is that components utilized in the circuit may differ as to value, power rating, and physical size. This document uses generalized descriptions by way of example only. Many variations for these constituent items are possible without departing from the spirit and scope of the invention.

Refer to FIG. 1, which is an exemplary simplified diagram of a reset system. Vcc 105 is the power supply, and is applied to elements of the circuit. Resistor 110 and resistor 115 form a voltage divider, such that the voltage of signal 140 is a constant less than 1.0 multiplied by the value of Vcc 105, thus being proportional to the value of Vcc 105. Bandgap reference 120 is used to develop a stable accurately known voltage at bandgap reference output 135, and a common value for this is 1.3 VDC. Comparator 125 compares signal 140 to bandgap reference output 135, and the output of comparator 125 is positive if signal 140 exceeds bandgap reference output 135, and zero or negative if bandgap reference output 135 exceeds signal 140. Signal 140 is greater than bandgap reference output 135 for normal operating conditions, and is less than bandgap reference output 135 when Vcc 105 is very low. It is normally arranged that signal 140 equals bandgap reference output 135 at that value of Vcc 105, which represents the minimum allowable operational voltage. Reset system output 130 is high for acceptable Vcc 105 levels, and low for Vcc 105 levels below the minimum allowable level. The polarity of system reset output 130 may be inverted if signal 140 and bandgap reference output 135 are reversed, wherein the polarity desired is a function of system design requirements.

During power down of Vcc 105, the operation of bandgap reference 120 and comparator 125 become uncertain since active circuits have minimum operational voltage supply levels below which proper operation is not guaranteed and operation may become erratic and unpredictable. If during a fast ramp down of Vcc 105 operational voltage is not maintained such that a valid reset signal can be produced, the system will not be forced to a reset condition with the result that shutdown performance is unpredictable.

This is a problem that is addressed and solved by the present invention. During fast ramp downs of Vcc 105 the analog circuitry can stop working before it has a chance to respond to the fact that Vcc 105 has crossed the reset threshold. For example, if Vcc 105 drops from 5 VDC to 1 VDC in 100 ns or less, the bandgap and comparator can stop working before they respond to the crossing of the reset threshold and the reset output can be left in the wrong state.

Note that any reset system structure may be used to replace the example of FIG. 1. The basic requirement is that the reset system output one state if the supply voltage is acceptable and a different state if the supply voltage is unacceptable. It is not required that bandgap, divider, and comparator structures be separate, or even identifiable as such, because other overall structures exist which provide equivalent functionality. An example would be the use of a separately powered A/D converter followed by a comparison in software or firmware to determine if Vcc 105 is high or low. The threshold value chosen may be fixed, or may be variable as when the threshold value is a function of a parameter such as operating temperature or cumulative run time. Therefore, reset system 100 is in general any combination of component parts which provide an acceptable/unacceptable decision, regarding the status of Vcc 105, that controls the application of power to downstream circuitry.

Figure 2:
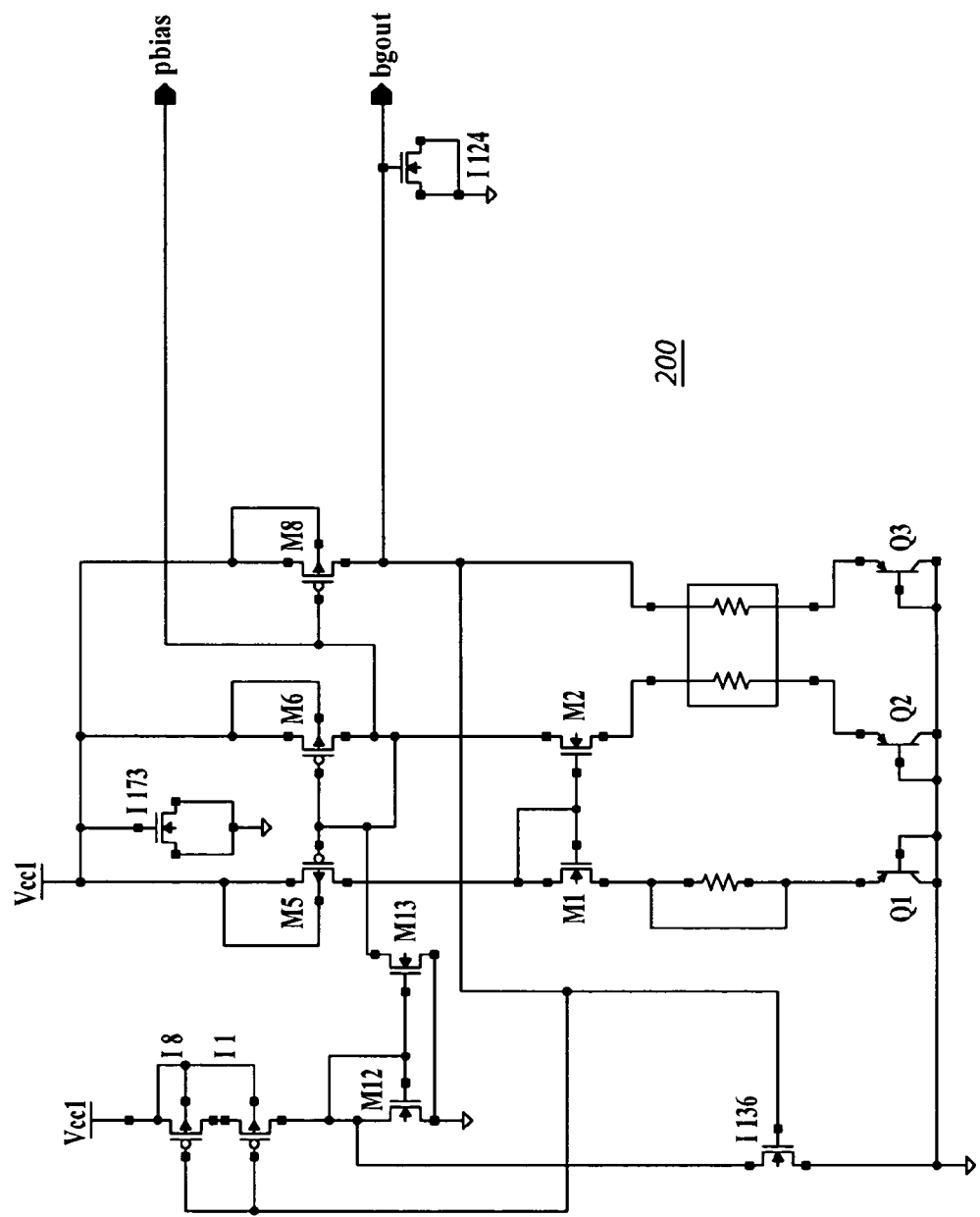
FIG. 2 is an exemplary simplified schematic diagram of a bandgap reference circuit, utilized in accordance with certain embodiments of the present invention.

Refer to FIG. 2, which is an exemplary simplified schematic diagram of a bandgap reference circuit, utilized in accordance with certain embodiments of the present invention. This circuit was utilized as part of an apparatus employed to test and validate the concepts and performance of the present invention. This bandgap reference produced a reference voltage of approximately 1.3 VDC to fulfill the function of bandgap reference 120 in reset system 100 of FIG. 1; other circuitry providing equivalent bandgap reference functionality may also be employed without departing from the spirit and scope of the invention. The specific circuit design will not be discussed here as it is not necessary to an understanding of the present invention.

Figure 3:
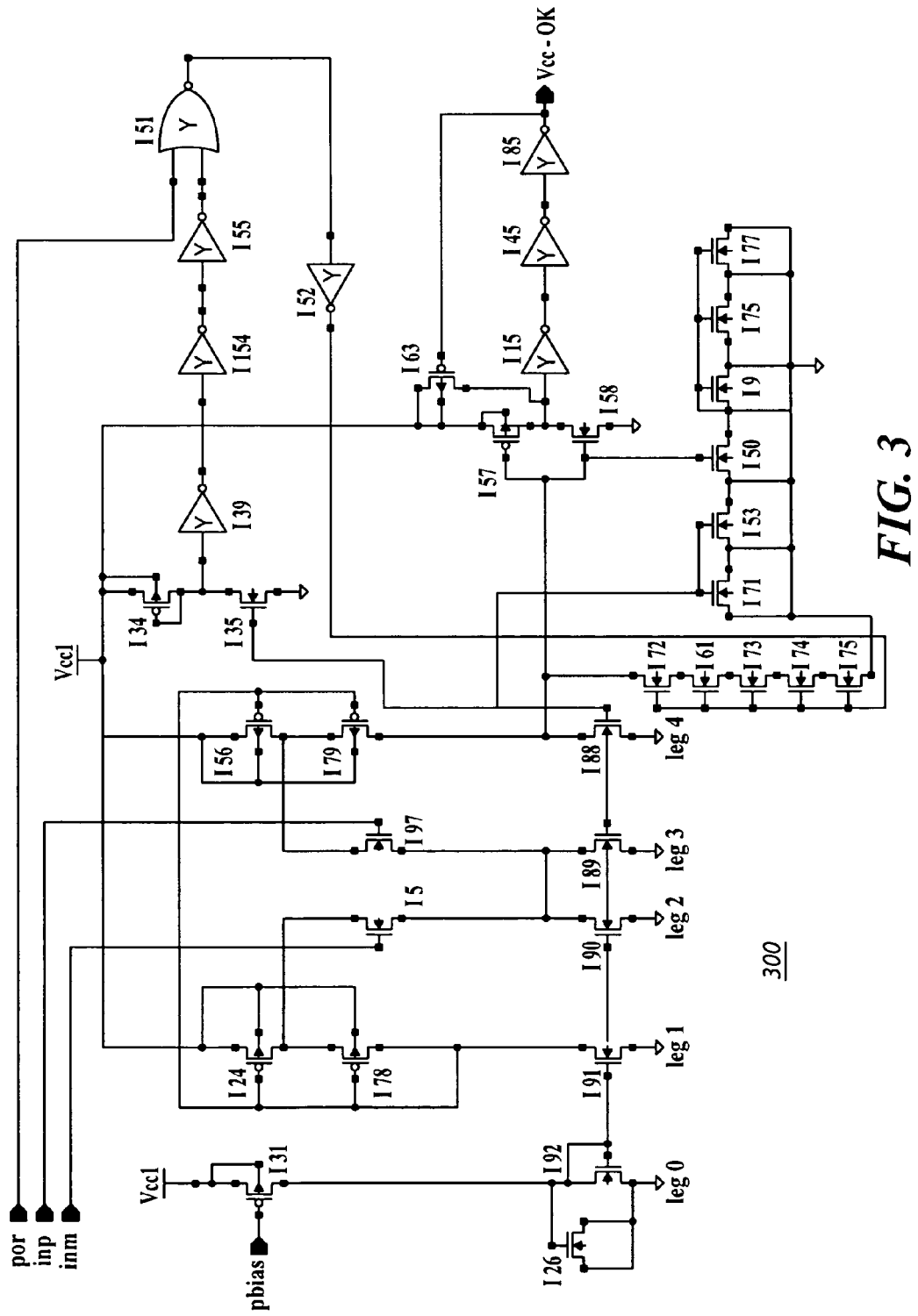
FIG. 3 is an exemplary simplified schematic diagram of a comparator circuit, utilized in accordance with certain embodiments of the present invention.

Refer to FIG. 3, which is an exemplary simplified schematic diagram of a comparator circuit, utilized in accordance with certain embodiments of the present invention. This circuit was utilized as part of an apparatus employed to test and validate the concepts and performance of the present invention. This comparator performs the comparator function of comparator 125 in reset system 100 of FIG. 1; other comparator circuitry providing equivalent comparator functionality may also be employed without departing from the spirit and scope of the invention. The specific circuit design will not be discussed here as it is not necessary to an understanding of the present invention.

Refer to FIG. 4, which is a simplified schematic diagram of a reset ramp control circuit (fast ramp down detection element) in accordance with certain embodiments of the present invention. Diode 405 and resistor 410 form a voltage divider for the voltage difference existing between Vcc 105 and ground. Inverter 415 is used to monitor voltage divider tap 440, so that when the voltage at voltage divider tap 440 swings downward through the trip point of inverter 415 the level of output 435 will change state from low to high. Diode 405 has a forward voltage drop of approximately 0.7 VDC in this exemplary embodiment, so that the voltage at voltage divider tap 440 is less than Vcc 105 by that amount. Resistor 410 is of noncritical value, and is utilized to provide a forward current path through diode 405 so that the aforementioned forward voltage drop is developed. With the voltage divider, the voltage at voltage divider tap 440 is closer to the trip point of inverter 415 by the amount of the forward voltage drop of diode 405.

When a Vcc 105 falling edge of sufficient magnitude occurs, the output of inverter 415 will change states from low to high. This will cause transistor 420 to go from an open state to a shorted state. In the open state, transistor 420 has a very high resistance between drain and source. In the shorted state, transistor 420 has a low resistance between drain and source. The voltage across capacitor 425 will therefore decay toward zero with a time constant determined primarily by the value of capacitor 425 and the shorted state resistance of transistor 420. Comparator 125 has a high output resistance as compared to the shorted state resistance of transistor 420, and therefore does not affect the time constant significantly. Other operational equivalent circuits are possible, of course. One example is if comparator 125 does not have high output resistance when not asserting reset, wherein the time constant calculation would take an interacting resistance into account using techniques known in the art.

Comparator 125 is the primary means for controlling the state of reset, which is reset output 430. If however a very fast drop in Vcc occurs, comparator 130 may not have time to respond. In that event the circuit of the present invention will provide reset functionality. When comparator 125 forces a reset to occur, as when Vcc 105 falls at a nominal or slow rate, it does so with a time constant determined by the value of capacitor 425 and the output resistance of the comparator, wherein the resistance is relatively low as the comparator is trying to force a low state at reset output 430. Transistor 420 is in the open state and provides a high resistance between drain and source, thus not significantly affecting the time constant. A time constant is desirable so that the reset output 430 will not change state as a result of fast temporary drops of Vcc 105 (glitches).

The circuit described above allows for reset output 430 to be in the correct state, even for fast ramp down and even if the bandgap or comparator are not working. In addition the circuit described above will force the reset to the correct state after a delay (time constant) which primarily depends on the value of capacitor 425 and the resistance of transistor 420 in the shorted state. Note that transistor 420 may be chosen to satisfy a time delay requirement.

Refer to FIG. 5, which is a simplified schematic diagram of equivalent circuits, in accordance with certain embodiments of the present invention. To maintain glitch immunity it is important to set the time constant invoked during operation of the present invention. As previously explained, this time constant is essentially dependent on the resistance of transistor 420 when in the shorted state and the value of capacitor 425. To decrease the time constant which will allow faster response, a transistor with lower shorted state resistance may be selected or the value of capacitor 425 may be decreased. To increase the time constant which will slow the response, a transistor with higher shorted state resistance may be selected, the value of capacitor 425 may be increased, or a modified approach such as shown by FIGS. 5(a) and (b) may be utilized. Note that it may not be desirable to change the value of capacitor 425, as it also in part determines the time constant of the standard reset operation.

In the example circuit built and tested to verify operation of the present invention, the modified circuit of FIG. 5(a) was utilized, consisting of a very weak long-L transistor consisting of 5 n-channels in series (transistors 505, 510, 515, 520, 525). Capacitor 425 was implemented as the sum of gate-drain and gate-source capacitance of a transistor with drain and source connected to ground. The delay measured with this combination was about 10 us, which was comparable to the propagation delay for reset when reset system 100 is utilized on medium to slow ramp downs. The test circuit responded to ramp downs of approximately 100 us or less, and was verified to work down to ramp downs of at least 10 ns. It is significant to note that the delay when utilizing the present invention may be modified independent of the delay of the reset system 100.

FIG. 5(b) illustrates that the reset delay of the present invention may also be controlled by resistor 535, which is in series with the shorted resistance of transistor 530. Resistor 535 may be implemented using active or passive devices, and its value may be fixed or adjustable (not shown). It is significant to note that the delay when utilizing the present invention may be modified independent of the delay of reset system 100.

Those of ordinary skill in the art will appreciate that many other circuit and system configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, other types of devices and circuits may be utilized for any component or circuit as long as they provide the requisite functionality. A further example is that the described structure may be implemented as part of an integrated circuit, or a hybrid circuit, or a discrete circuit, or combinations thereof. Yet another example is that the features of the present invention may be adapted to all DC power systems regardless of voltages. Accordingly, it is intended that the present invention embrace all such alternatives, modifications and variations as fall within the scope of the appended claims.

What is claimed is:

1. A reset ramp control structure, comprising:
   a reset system element, coupled to the voltage to be monitored; and
   a fast ramp down detection element, which is coupled to the reset system element, and
   wherein during a ramp down condition of the voltage to be monitored the fast ramp down detection element forces an output of the reset system element to a known value and wherein during a slow ramp down condition of the voltage to be monitored the output of the reset system element is not forced by the fast ramp down detection element, and
   wherein the fast ramp down detection element further comprises:
      the voltage to be monitored is coupled to an anode of a diode;
      a first resistive element is coupled between a cathode of the diode and ground, and to an input terminal of an inverter;
      a gate of a transistor is coupled to an output of the inverter;
      a source of the transistor is coupled to ground; and
      a drain of the transistor is coupled to an output of the reset system element and to a capacitor.

2. The reset ramp control structure of claim 1, wherein a delay to force the output of the reset system element to the known value is set by modifying limits in the fast ramp down detection element.

3. The reset ramp control structure of claim 1, wherein the diode is a forward biased diode and the voltage drop of the forward biased diode is utilized to increase the sensitivity of the fast ramp down detection element.

4. The reset ramp control structure of claim 1, wherein the transistor of the fast ramp down detection element is utilized to initiate a delay in the output of the reset system.

5. The reset ramp control structure of claim 4, wherein resistance of the transistor of the fast ramp down detection element controls the magnitude of the delay.

6. The reset ramp control structure of claim 1, wherein a resistor of the fast ramp down detection element and a transistor of the fast ramp down detection element are utilized to initiate a delay in the output of the reset system.

7. The reset ramp control structure of claim 6, wherein the resistor substantially controls the magnitude of the delay.

8. The reset ramp control structure of claim 6, wherein the resistor and transistor are coupled in series.

9. A reset ramp control structure, comprising:
   a reset system element, coupled to the voltage to be monitored; and
   a fast ramp down detection element, which is coupled to the reset system element, and
   wherein during a ramp down condition of the voltage to be monitored the fast ramp down detection element forces an output of the reset system element to a known value and wherein during a slow ramp down condition of the voltage to be monitored the output of the reset system element is not forced by the fast ramp down detection element, wherein the fast ramp down detection element further comprises:
      the voltage to be monitored is coupled to a first conduction terminal of a first transistor; and
      a terminal of a first resistive element is coupled to a second conduction terminal of the first transistor and to an input terminal of an inverter, a control terminal of the first transistor coupled in a way to make the first transistor behave as a diode; and
      a gate of a second transistor is coupled to an output of the inverter; and
      the source of the second transistor is coupled to ground; and
      the drain of the second transistor is coupled to an output of the reset system element and to a capacitor.

10. The reset ramp control structure of claim 9, wherein the first and second transistors of a plurality of transistors of the fast ramp down detection element are utilized to initiate a delay in the output of the reset system.

11. The reset ramp control structure of claim 10, wherein the plurality of transistors are coupled in series.

12. The reset ramp control structure of claim 10, wherein the resistance of the plurality of transistors controls the magnitude of the delay.

13. The reset ramp control structure of claim 9, wherein a delay to force the output of the reset system element to the known value is set by modifying limits in the fast ramp down detection element.

14. A reset ramp control apparatus, operable to supply nonambiguous control of a system reset during fast ramp down conditions, comprising:
   a fast ramp down detection element to force an output of the system reset to a known state during a fast ramp down condition of a monitored voltage in accordance with a reset delay; and
   means to modify the reset delay,
   wherein during a slow ramp down condition of the voltage to be monitored the output of the system reset is not forced,
   wherein the fast ramp down detection element further comprises:
      the voltage to be monitored is coupled to an anode of a diode;
      a first resistive element is coupled between a cathode of the diode and ground, and to an input terminal of an inverter;
      a gate of a transistor is coupled to an output of the inverter;
      a source of the transistor is coupled to ground; and
      a drain of the transistor is coupled to an output of a reset element and to a capacitor.

15. The reset ramp control apparatus of claim 14, wherein a delay to force the output of the system reset to the known state is set by modifying limits in the reset ramp control apparatus.

16. The reset ramp control apparatus of claim 14, wherein the voltage drop of a forward biased diode of the fast ramp down detection element is utilized to increase the sensitivity of the reset ramp control apparatus.

17. The reset ramp control apparatus of claim 14, wherein a transistor of the fast ramp down detection element is utilized to initiate a delay in the output of the system reset.

18. The reset ramp control apparatus of claim 17, wherein resistance of the transistor of the fast ramp down detection element controls the magnitude of the delay.

19. The reset ramp control apparatus of claim 14, wherein a resistor and a transistor of the fast ramp down detection element are utilized to initiate a delay in the output of the system reset.

20. The reset ramp control structure of claim 19, wherein the resistor of the fast ramp down detection element substantially controls the magnitude of the delay.

21. The reset ramp control structure of claim 19, wherein the resistor and transistor of the fast ramp down detection element are coupled in series.

22. A reset ramp control apparatus, operable to supply nonambigiuous control of a system reset during fast ramp down conditions, comprising:
    a fast ramp down detection element to force an output of the system reset to a known state during a fast ramp down condition of a monitored voltage in accordance with a reset delay; and
    means to modify the reset delay, wherein during a slow ramp down condition of the voltage to be monitored the output of the system reset is not forced, wherein the fast ramp down detection element further comprises:
    the voltage to be monitored is coupled to a source of a first transistor; and
    a first resistive element is coupled between a drain a gate of the first transistor and ground, and to an input terminal of an inverter; and
    a gate of a second transistor is coupled to an output of the inverter; and
    a source of the second transistor is coupled to ground; and
    a drain of the second transistor is coupled to an output of the reset system element and to a capacitor.

23. The reset ramp control apparatus of claim 22, wherein a delay to force the output of the system reset to the known state is set by modifying limits in the reset ramp control apparatus.

24. The reset ramp control apparatus of claim 22, wherein the first and second transistors of a plurality of transistors of the fast ramp down detection element are utilized to initiate a delay in the output of the reset system.

25. The reset ramp control structure of claim 24, wherein the plurality of transistors of the fast ramp down detection element are coupled in series.

26. The reset ramp control structure of claim 24, wherein the resistance of the plurality of transistors of the fast ramp down detection element controls the magnitude of the delay.

* * * * *